United States Patent
Heerens et al.

(10) Patent No.: US 7,839,489 B2
(45) Date of Patent: Nov. 23, 2010

(54) ASSEMBLY OF A RETICLE HOLDER AND A RETICLE

(75) Inventors: Gert-Jan Heerens, Schoonhoven (NL); Bastiaan Lambertus Wilhelmus Marinus Van De Ven, Den Bosch (NL)

(73) Assignee: ASML Netherlands B.V., Veldhoven (NL)

( * ) Notice: Subject to any disclaimer, the term of this patent is extended or adjusted under 35 U.S.C. 154(b) by 669 days.

(21) Appl. No.: 11/812,166

(22) Filed: Jun. 15, 2007

(65) Prior Publication Data

US 2007/0247609 A1 Oct. 25, 2007

Related U.S. Application Data

(62) Division of application No. 10/962,751, filed on Oct. 13, 2004, now Pat. No. 7,236,233.

(30) Foreign Application Priority Data

Oct. 27, 2003 (EP) .................... 3078380

(51) Int. Cl.
G03B 27/62 (2006.01)
G03B 27/58 (2006.01)
(52) U.S. Cl. .......................... 355/75; 355/72
(58) Field of Classification Search ............ 355/53, 355/72–76; 430/5, 20, 30
See application file for complete search history.

(56) References Cited

U.S. PATENT DOCUMENTS

| | | | |
|---|---|---|---|
| 4,443,098 A * | 4/1984 | Walwyn et al. | 355/74 |
| 5,471,279 A * | 11/1995 | Takizawa | 355/73 |
| 5,608,773 A * | 3/1997 | Korenaga et al. | 378/34 |
| 6,216,873 B1 | 4/2001 | Fosnight et al. | 206/710 |
| 6,906,783 B2 * | 6/2005 | del Puerto et al. | 355/53 |
| 6,931,700 B2 * | 8/2005 | Uchiyama | 29/25.35 |
| 7,236,233 B2 | 6/2007 | Heerens et al. | |
| 7,396,558 B2 * | 7/2008 | Fujimori et al. | 427/66 |
| 2002/0066692 A1 | 6/2002 | Smith et al. | 206/710 |

FOREIGN PATENT DOCUMENTS

| | | |
|---|---|---|
| EP | 0 284 003 A1 | 9/1988 |
| EP | 0 522 865 B1 | 9/1997 |
| EP | 0 923 000 A2 | 6/1999 |

(Continued)

OTHER PUBLICATIONS

English translation of Japanese Official Action issued for Japanese Patent Application No. 2004-310376, dated Nov. 15, 2007.

(Continued)

*Primary Examiner*—Hung Henry Nguyen
(74) *Attorney, Agent, or Firm*—Sterne, Kessler, Goldstein & Fox P.L.L.C.

(57) ABSTRACT

A system for use in a lithographic apparatus includes an assembly of a reticle and a reticle holder. The reticle includes a marker. The system also includes a position detector arranged to detect the reticle marker to position the reticle with respect to the reticle holder, and a storage container constructed and arranged to store the assembly during the positioning of the reticle with respect to the reticle holder. The reticle holder and the detector are arranged to be kinematically aligned with respect to each other.

20 Claims, 8 Drawing Sheets

FOREIGN PATENT DOCUMENTS

| | | |
|---|---|---|
| EP | 0 923 000 A3 | 12/2000 |
| EP | 1 341 042 A2 | 9/2003 |
| EP | 1 341 042 A3 | 3/2004 |
| JP | 56-24335 | 3/1981 |
| JP | 58-21824 | 2/1983 |
| JP | 62-198863 A | 9/1987 |
| JP | 64-033927 | 2/1989 |
| JP | 02-119114 | 5/1990 |
| JP | 4-75063 | 3/1992 |
| JP | 4-172454 A | 6/1992 |
| JP | 6-325996 A | 11/1994 |
| JP | 10-010705 A | 1/1998 |
| JP | 10-282639 A | 10/1998 |
| JP | 11-015143 | 1/1999 |
| JP | 2000-137330 | 5/2000 |
| JP | 2000-174102 | 6/2000 |
| JP | 2002-287333 | 10/2002 |
| JP | 2003-257852 A | 9/2003 |

OTHER PUBLICATIONS

Examination for European Application No. 04077961.3-1226 mailed May 19, 2009, 9 pgs.

European Search Report, Appl. No. EP 04 07 7961, mailed Feb. 18, 2005, 4 pgs.

Notice of Reasons for Rejection mailed Feb. 23, 2010 for Japanese Patent Application No. 2008-023872, 3 pgs.

Non-Final Rejection mailed Nov. 3, 2006 for U.S. Appl. No. 10/962,751, 10 pgs.

* cited by examiner

ASSEMBLY OF A RETICLE HOLDER AND A RETICLE

CROSS-REFERENCE TO RELATED APPLICATIONS

This application is a divisional application of U.S. patent application Ser. No. 10/962,751, filed on Oct. 13, 2004, (that issued as U.S. Pat. No. 7,236,233), which claims the benefit of priority from European Patent Application No. 3078380.7, filed Oct. 27, 2003, the entire contents of which are both incorporated herein by reference.

FIELD

The invention relates to an assembly of a reticle and a reticle holder.

BACKGROUND

An assembly of a reticle and a reticle is generally known from the art. The reticle of the known assembly may, for example, be suitable and arranged for use in a lithographic process, carried out by a lithographic apparatus, to manufacture devices. In the known assembly, the reticle holder may be arranged to hold the reticle using a clamping device. In particular, the known reticle holder may be a storage box for storing and transporting the reticle. In certain cases, the reticle may need to be aligned accurately with respect to the reticle holder before the assembly may be used in a manufacturing process. Usually, such alignment is carried out by a reticle prealigner.

It may be relatively difficult to maintain the reticle in a certain desired, for example, aligned, position with respect to the reticle holder when being held thereby. As a consequence, the reticle may shift under the influence of vibrations and/or acceleration during transport of the assembly, which may lead to misalignment of the reticle. Such undesired reticle movement may lead to undesired particle generation due to friction between the reticle and the reticle holder. Such particles may impair processes making use of the reticle, for example, vacuum processes and/or lithographic processes, in which the processes require substantially contamination-free process environments. In the known reticle holder, movement of the reticle is prevented by using relatively large clamping or friction forces. However, such forces lead to a high contact stress, which may damage the reticle and/or reticle holder.

SUMMARY

It is an aspect of the present invention to provide an improved assembly of a reticle and a reticle holder. Particularly, it is an aspect of the invention to provide an assembly of a reticle and a reticle holder, in which the reticle may be maintained safely in a desired position with respect to the reticle holder.

According to an embodiment, an assembly for use in a lithographic apparatus is provided. The assembly includes a reticle, and a reticle holder. The reticle holder is adjustable between a form closed reticle blocking state and a reticle releasing state. The reticle holder is arranged to (1) hold the reticle in a form closed manner in at least one direction when the reticle holder is in the blocking state, and (2) release the reticle when the reticle holder is in the releasing state. That is, when the reticle holder is in the form closed reticle blocking state, the reticle holder prevents movement of the reticle with respect to the reticle holder in at least one direction without friction.

According to an embodiment, an assembly for use in a lithographic apparatus is provided. The assembly includes a reticle, and a reticle holder. The reticle holder is adjustable between a form closed reticle blocking state for engaging the reticle, and a reticle releasing state for releasing the reticle. The reticle holder is arranged to (1) prevent movement of the reticle with respect to the reticle holder in at least one direction without friction when the reticle holder is in the form closed reticle blocking state, and (2) release the reticle when the reticle holder is in the reticle releasing state.

The state of the reticle holder is adjustable between a reticle blocking state and a reticle releasing state. The reticle holder is also arranged to hold the reticle at least in a form closed manner (without friction) in at least one direction when the reticle holder is in the blocking state. The reticle holder is arranged to release the reticle when the reticle holder is in the releasing state. Therefore, the reticle holder may prevent an undesired movement of the reticle in the at least one direction, using form closed reticle fixation, for example, during transport of the assembly. Consequently, the reticle may maintain a certain position, for example, a certain aligned position, with respect to the reticle holder. Furthermore, particle creation may be prevented. Because the reticle may be held in a form closed manner, the reticle may be held using substantially no force closure in the at least one direction, for example, by using clamping or friction forces. Therefore, the reticle may be held while the reticle experiences relatively little retaining forces, acted thereon by the reticle holder, so that reticle damage or fracture may be prevented. The present assembly of a reticle and reticle holder may have different application. The assembly may be used, for example, in combination with a lithographic apparatus, a reticle inspecting device, a reticle transport system and the like.

According to an embodiment, the reticle holder includes at least one movable reticle retaining element that is movable between a reticle blocking position and a reticle releasing position for providing the form closed blocking state and releasing state, respectively. The at least one movable reticle retaining element is arranged to be fixed in the blocking position.

The reticle may simply be fixed in a form closed manner by fixing each reticle retaining element in its blocking position. The reticle is released when the at least one retaining element is moved from the blocking position to the releasing position. Preferably, the distance between each of the reticle retaining elements, and the reticle is less than about 1 μm when the retaining element is in the blocking position, and the reticle is held by the reticle holder, so that the form closure of the reticle is relatively tight and reticle movement may be prevented well in the at least one direction. Furthermore, the distance between each reticle retaining element and the reticle may be, for example, larger than about 1 μm, particularly larger than about 100 μm, more particularly larger than about 1 mm, when the retaining element is in the releasing position to provide enough space for releasing the reticle. The distance may be detected using suitable sensors, and the movement of the movable retaining elements may be controlled by suitable control device, so that the form closure may be effected automatically.

According to an embodiment, the reticle holder includes at least a substance, for example, a freezable fluid and/or a ferromagnetic fluid, which may be brought into a solid state and a deformable state for providing the form closed blocking state and releasing state, respectively.

The reticle may be fixed in a form shaped manner by bringing the substance into the solid state. The reticle may be released when the substance is brought into the deformable state. The substance may include different materials in different forms. The substance may include, for example, one or more fluids, a thermoplastic, and/or a combination of these, or any other suitable substance. The solid state may be, for example, a state of high viscosity of the substance, in which the substance has a lower viscosity in the deformable state. In case the substance is a fluid, the deformable state may be a fluid state, for example, a liquid state, of the fluid. The substance may be contained, for example, in a flexible container to prevent that the reticle holder from losing the substance when it is in the deformable state.

According to an embodiment, the reticle holder includes at least one immovable reticle retaining element which is arranged to abut at least part of the reticle for holding the reticle in the form closed manner.

The at least one immovable retaining element may, for example, cooperate with other parts of the reticle holder, particularly with the movable retaining element and/or with the substance, to hold the reticle in a form closed manner. The at least one immovable retaining element may further serve to align the reticle with respect to the reticle holder, which may make the use of a reticle prealigner abundant.

It is an aspect of the present invention to provide a system that includes an assembly of a reticle and reticle holder.

According to an embodiment, a system for use in a lithographic apparatus is provided. The system includes an assembly of a reticle and a reticle holder. The reticle includes a marker. The system also includes a position detector arranged to detect the reticle marker for positioning the reticle with respect to the reticle holder, and a storage box for storing the assembly during the positioning of the reticle with respect to the reticle holder. The reticle holder and the detector are arranged to be kinematically aligned with respect to each other.

"Kinematically aligned," as used herein, may also be referred to as "precisely aligned" through the use of a plurality of precision-machined mechanical contacts. The contacts are arranged on each of the two parts to be kinematically aligned such that when the two parts come together, relative motion between the two parts is prevented. Such an arrangement creates a precise and repeatable interface between the two parts. Preferably, three precision-machined mechanical contacts are used, as will be discussed below. "Kinematically docking," as used herein, may also be referred to as the coming together of two parts that are kinematically aligned. Thus, if two parts have been kinematically docked, they have been precisely aligned through the use of the plurality of mechanical contacts.

As follows from the above, an assembly of a reticle and reticle holder is known from the art. The reticle holder may be used for facilitating the handling of the reticle. For example, the reticle holder may be used to transport a reticle to and from a reticle stage. A disadvantage of the known assembly is that the reticle holder needs to be removed from the reticle when the reticle is to be placed, for example, in a storage box for storage and/or transportation thereof. The removal of the reticle holder leads to handling risks, lower MTBF, and increased machine costs. Another problem of such an assembly is that a desired precise positioning of the reticle with respect to the reticle holder is relatively complicated. Therefore, the positioning of the reticle onto the holder takes too much time, which reduces the throughput of a lithographic apparatus or lithographic manufacturing method utilizing such a reticle/reticle holder assembly.

It is an aspect of the present invention to provide a system, in which a reticle and reticle holder may be positioned relatively precise and fast with respect to each other.

According to an embodiment a system that includes an assembly of a reticle and reticle holder, as well as at least one detector is provided. The reticle includes one or more markers. The reticle holder and the detector are arranged to be kinematically aligned with respect to each other. The detector is arranged to detect the reticle markers for positioning the reticle with respect to the reticle holder.

During use, the reticle may be aligned with respect to the reticle holder relatively fast and accurately by making use of kinematical alignment and marker-alignment.

The reticle holder may be kinematically aligned with respect to the at least one detector. After the alignment of the reticle holder with respect to the detector, the reticle may be positioned with respect to the reticle holder utilizing detection of the markers by the detector. For example, the reticle may be positioned such with respect to the reticle holder such that the reticle obtains a certain desired position with respect to the holder, for example, a predetermined position. The predetermined position may be suitable for placing the reticle in a lithographic apparatus without having to realign the reticle with respect to the reticle holder again. In that case, after the positioning of the reticle with respect to the reticle holder, the reticle holder may be transported, for example, to a reticle stage of the lithographic apparatus for placing the reticle directly in a predetermined operating position thereon, without any further reticle alignment steps necessary.

The system may include at least one storage container for storing the assembly at least during the alignment thereof. In that case, the alignment of the reticle may be achieved in a relatively clean space, within the storage container, so that handling risks, caused by any removal of the reticle and/or reticle from the storage container, may be reduced.

For example, in a method for aligning a reticle with respect to a reticle holder, the assembly of the reticle and reticle holder may be placed in a storage container first. After that, the reticle and reticle holder may be aligned with respect to each other, for example, by using one or more reticle markers and marker detectors. The alignment of the reticle with respect to the reticle holder may be the same, for example, as has been described above, such that the reticle holder may place the reticle in a operating position without any further reticle/reticle holder alignment needed. The storage container may protect the aligned reticle/reticle holder assembly before and/or after the assembly is to be used.

The assembly of the reticle and reticle holder may be arranged in various ways. For example, the assembly may be an assembly as previously described, such that the reticle holder may be arranged to hold the reticle at least in a form closed manner in at least one direction when the reticle holder is in the blocking state. The reticle holder may be arranged to release the reticle when the reticle holder is in the releasing state. This may provide the above-mentioned advantages of the form-closure-fixation of the reticle.

According to an embodiment, the system includes a support structure for supporting the reticle holder. The structure includes docking elements, or docking apertures, which are arranged to cooperate with docking apertures, or docking elements, of the reticle holder for kinematically docking the reticle holder onto the support structure. The detector is located in a certain detector position with respect to the support structure for detecting the reticle markers. This may provide an advantageous construction for docking the reticle holder and aligning the reticle. In an embodiment, the support structure is simply integrally attached to the detector.

According to an aspect of the invention, there is provided a support structure that is arranged for kinematically docking a reticle holder storage container. The support structure is also arranged for kinematically docking a reticle holder that is being held in the storage container. In that case, the storage container, as well as the reticle holder contained therein may be aligned accurately with respect to each other via the support structure. Therefore, positioning and/or transport of the reticle may be effected in a relatively simple manner and relatively fast. Thus, manufacturing costs of devices, manufactured using one or more reticles which are positioned using one or more of the support structure, may be reduced. Also, the costs of a lithographic apparatus may be reduced when the apparatus is provided with one or more such support structures and/or when the apparatus is arranged to make use of one or more such support structures.

The invention further provides a reticle holder that may be used in the assembly described herein. Such a reticle holder may provide the above-mentioned advantages. Particularly, for the case that the reticle holder is a holder of the above-described assembly, a reticle may be held firmly by the reticle holder in the at least one direction, preferably without the application of reticle force fixation or using only a small amount of force fixation. Such a reticle holder may be arranged in different ways. The reticle holder may be or include, for example, a frame for supporting the reticle. The reticle holder may be a reticle storage container. In that case, the storage container may be arranged to hold the reticle directly, so that the reticle is not being held by any other reticle holding device. Furthermore, the reticle holder may be, for example, part of a storage container, such as a separate reticle holding frame, which may be removed from a further storage container part. Also, an outer storage container may be provided which is arranged for containing one or more inner storage containers. Each inner storage container may be arranged as a reticle holder.

For the case that the reticle holder is a holder of the above-described system, the reticle and the reticle holder may be positioned relatively fast and precise with respect to each other, for example, such that the reticle may be placed directly in an operating position in a lithographic apparatus utilizing the holder. Also, in that case, preferably the reticle/reticle holder assembly may be stored in a suitable transportable storage container, for example, for protecting the assembly during storage and/or transportation thereof.

The invention also relates to a storage container. According to the invention, the storage container is arranged for storing an assembly that includes a reticle and a reticle holder. The storage container includes a retainer arranged to (1) retain the reticle holder when the retainer is in a holder retaining state, and (2) to release the reticle holder when the retainer is in a holder releasing state.

The assembly of the reticle and reticle holder may be contained by the storage container, for example, to store the assembly in a well conditioned, relatively contamination free environment. Furthermore the storage container may serve to protect the assembly from adverse mechanical influences. Because the storage container is arranged to contain the assembly, the reticle may be handled with ease. For example, the reticle holder does not have to be removed from the reticle in case the reticle needs to be stored in the storage container.

According to a further embodiment of the invention, the storage container includes at least one retainer that is arranged to retain the reticle holder when the retainer is in a holder retaining state, wherein the retainer is arranged to release the reticle holder when the retainer is in holder releasing state.

The reticle holder may be retained in the storage container at will, utilizing the retainer. This may improve the handling possibilities of the reticle and reticle holder assembly with respect to the storage container. For example, the reticle holder may be moved from or to the storage container when the retainer is in the releasing state. A reticle may be moved from a reticle holder when that holder is retained by the retainer in the storage container. The reticle may, for example, be removed from the storage container without the reticle holder for cleaning purposes.

According to an aspect of the invention, the storage container may be arranged to cooperate with a support structure for kinematically docking the storage container thereon. At least part of the storage container may be optically transparent, such that the detector may detect the reticle marker simply optically during use, using relatively simple optical detectors.

It is an aspect of the present invention to provide a lithographic apparatus and a device manufacturing method.

A lithographic apparatus is a machine that applies a desired pattern onto a target portion of a substrate. Lithographic apparatus may be used, for example, in the manufacture of integrated circuits (ICs). In that circumstance, a patterning device, such as a mask, may be used to generate a circuit pattern corresponding to an individual layer of the IC, and this pattern may be imaged onto a target portion (e.g. including part of, one, or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called smayners, in which each target portion is irradiated by scanning the pattern through the projection beam in a given direction (the "scanning"-direction) while synchronously scanning the substrate parallel or anti-parallel to this direction.

According to an aspect of the invention, there is provided a lithographic apparatus that includes an illumination system for providing a beam of radiation, and an assembly that includes a reticle and a reticle holder. The reticle serves to impart the beam of radiation with a pattern in its cross-section. The reticle holder is adjustable between a form closed reticle blocking state and a reticle releasing state. The apparatus also includes a substrate table for holding a substrate, and a projection system for projecting the patterned beam onto a target portion of the substrate. The reticle holder is arranged to (1) prevent movement of the reticle with respect to the reticle holder in at least one direction without friction when the reticle holder is in the form closed reticle blocking state, and (2) release the reticle when the reticle holder is in the reticle releasing state.

According to an aspect of the invention, there is provided a lithographic apparatus that includes an illumination system for providing a beam of radiation, and a system that includes an assembly of a reticle, which includes a marker, and a reticle holder, a detector arranged to detect the reticle marker for positioning the reticle with respect to the reticle holder, and a storage container for storing the assembly during the positioning of the reticle with respect to the reticle holder. The reticle serves to impart the beam of radiation with a pattern in its cross-section. The apparatus also includes a substrate table for holding a substrate, and a projection system for projecting the patterned beam onto a target portion of the substrate. The reticle holder and the detector are arranged to be kinematically aligned with respect to each other.

The above-mentioned features of the assembly, the system, the support structure, the storage container and/or the reticle holder may be provided to the lithographic apparatus.

Particularly, the reticle may be handled and positioned relatively fast using the reticle holder, so the apparatus may have a low overhead and achieve a high productivity.

Moreover, the reticle may be aligned with respect to the reticle holder precisely and fast when using the system and/or the support structure, preferably such that the reticle may be placed on the support structure for supporting the patterning device directly, using the reticle holder.

According to a further aspect of the invention, a device manufacturing method is provided. The method includes patterning a beam of radiation with a reticle, handling the reticle with an assembly, and projecting the patterned beam of radiation onto a target portion of a substrate. The assembly includes the reticle and a reticle holder. The reticle holder is adjustable between a form closed reticle blocking state and a reticle releasing state, and the reticle holder is arranged to (1) prevent movement of the reticle with respect to the reticle holder in at least one direction without friction when the reticle holder is in the form closed reticle blocking state, and (2) release the reticle when the reticle holder is in the reticle releasing state.

In an embodiment, a device manufacturing method includes positioning a reticle, which includes a marker, with respect to a reticle holder, and detecting the marker for the positioning of the reticle with respect to the reticle holder with a detector. The reticle holder and the detector are arranged to be kinematically aligned with respect to each other. The method also includes storing the reticle and the reticle holder in a storage container during the positioning of the reticle with respect to the reticle holder, patterning a beam of radiation with the reticle, and projecting the patterned beam of radiation onto a target portion of a substrate.

According to an aspect of the present invention, a method for aligning a reticle with respect to a reticle holder is provided. The reticle includes a marker. The method includes kinematically aligning the reticle holder with respect to a position detector, detecting the marker with the position detector, and positioning the reticle with respect to the reticle holder.

In an embodiment, a method for aligning a reticle with respect to a reticle holder is provided. The reticle includes a marker. The method includes precisely aligning the reticle holder with respect to a position detector with a plurality of precision-machined mechanical contacts that are arranged to prevent relative motion between the reticle holder and the detector in at least two directions, detecting the marker with the position detector; and positioning the reticle with respect to the reticle holder based on the detecting.

Because at least one assembly according to the invention and/or at least one system according to the invention is used for reticle handling, one or more reticles may be handled efficiently and safely. Also, the reticle may be aligned accurately, using relatively little alignment steps.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" as used herein should be broadly interpreted as referring to a device that may be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which may be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example, with respect to the projection system. Any use of the terms "reticle" or "mask" herein may be considered synonymous with the more general term "patterning device".

The term "projection system" as used herein should be broadly interpreted as encompassing various types of projection system, including refractive optical systems, reflective optical systems, and catadioptric optical systems, as appropriate, for example, for the exposure radiation being used, or for other factors, such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Unless specifically indicated, in this application, terms such as 'circa', 'about' or similar terms should be understood as meaning a value which may at least deviate plus and minus 10% from the mentioned value.

Figure 1:
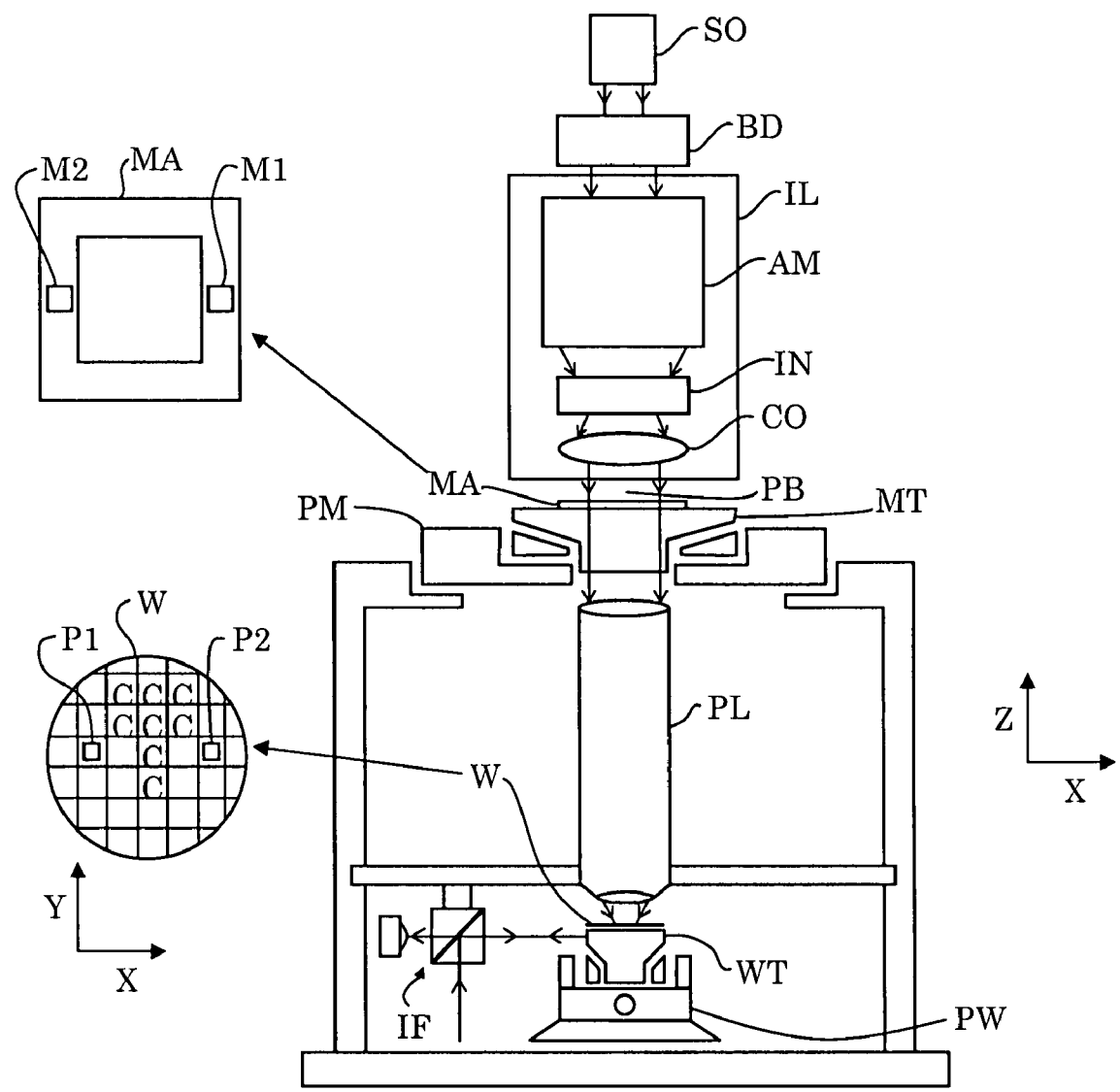
FIG. 1 depicts a lithographic apparatus according to an embodiment of the invention.

FIG. 1 schematically depicts a lithographic apparatus according to a particular embodiment of the invention. The apparatus includes: an illumination system (illuminator) IL for providing a projection beam PB of radiation (e.g. UV radiation, EUV radiation or an other type of radiation); a first support structure (e.g. a mask table) MT for supporting a patterning device (e.g. a mask) MA and connected to a first positioning device PM for accurately positioning the patterning device with respect to item PL; a substrate table (e.g. a wafer table) WT for holding a substrate (e.g. a resist-coated wafer) W and connected to a second positioning device PW for accurately positioning the substrate with respect to item PL; and a projection system (e.g. a refractive projection lens) PL for imaging a pattern imparted to the projection beam PB by the patterning device MA onto a target portion C (e.g. including one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases, the source may be integral part of the apparatus, for example, when the source is a mercury lamp. The source SO and the illuminator IL, together with the beam delivery system BD if required, may be referred to as a radiation system.

The illuminator IL may include an adjusting device AM for adjusting the angular intensity distribution of the beam. Generally, at least the outer and/or inner radial extent (commonly referred to as σ-outer and σ-inner, respectively) of the intensity distribution in a pupil plane of the illuminator may be adjusted. In addition, the illuminator IL generally includes various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning device PW and position sensor IF (e.g. an interferometric device), the substrate table WT may be moved accurately, e.g. so as to position different target portions C in the path of the beam PB. Similarly, the first positioning device PM and another position sensor (which is not explicitly depicted in FIG. 1) may be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

During use of the apparatus shown in FIG. 1, a reticle storage container according to embodiments of the present invention and/or a reticle holder according to embodiments of the present invention is utilized for reticle handling.

Figure 2:
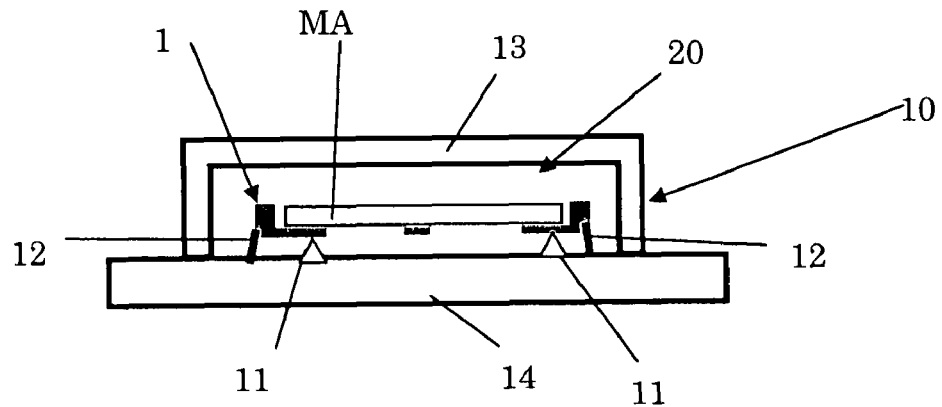
FIG. 2 schematically shows a partially opened side view of an embodiment of the invention, in which both a reticle and a reticle holder are stored in a storage container.

FIG. 2 schematically shows an embodiment of the present invention, which includes a storage container 10 which is arranged for storing an assembly of a reticle MA and a reticle holder 1. The container 10 may be a box or any other type of receptacle. The reticle holder 1 may be, for example, a kinematic handling frame for kinematically aligning the reticle MA with respect to a certain apparatus, particularly with respect to a lithographic apparatus. The reticle holder 1 may be arranged, for example, according to the embodiments thereof shown in FIGS. 5-8, for holding the reticle MA at least by form closure as is described below. Alternatively, the reticle holder 1 may be arranged to hold the reticle MA in a different manner, for example, by force closure.

The storage container 10 includes a base 14 and a cover 13 which enclose a storage space 20. In FIG. 2, the assembly of a reticle MA and a reticle holder 1 is stored in the storage space 20 of the storage container 10. The cover 13 is detachably coupled to the base 14, for example, by a clicking structure, a clamping device, a spring and/or any other suitable device. The base 14 of the storage container 10 is provided with support elements 11 for supporting the bottom side of the reticle holder 1. It is advantageous when the reticle holder 1 and the support elements 11 are arranged to cooperate with each other for kinematical docking and positioning the reticle holder 1 onto the support elements 11. Such kinematical docking may be achieve in various ways, for example, by using tapered pin-shaped support elements 11, while the bottom of the reticle holder 1 is provided with tapered receiving openings 9 for receiving the tapered support elements 11, as is shown in FIGS. 2-4.

Figure 4:
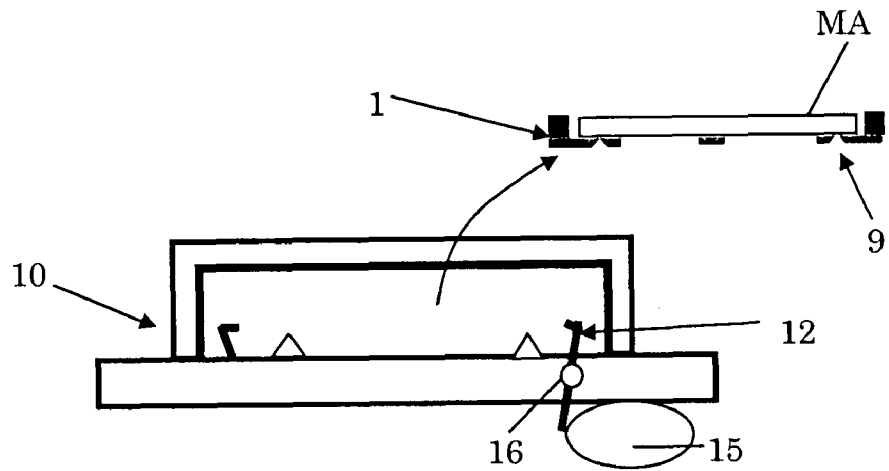
FIG. 4 show a view similar to FIG. 2 in which the reticle holder is removed from the storage container.
Figure 5:
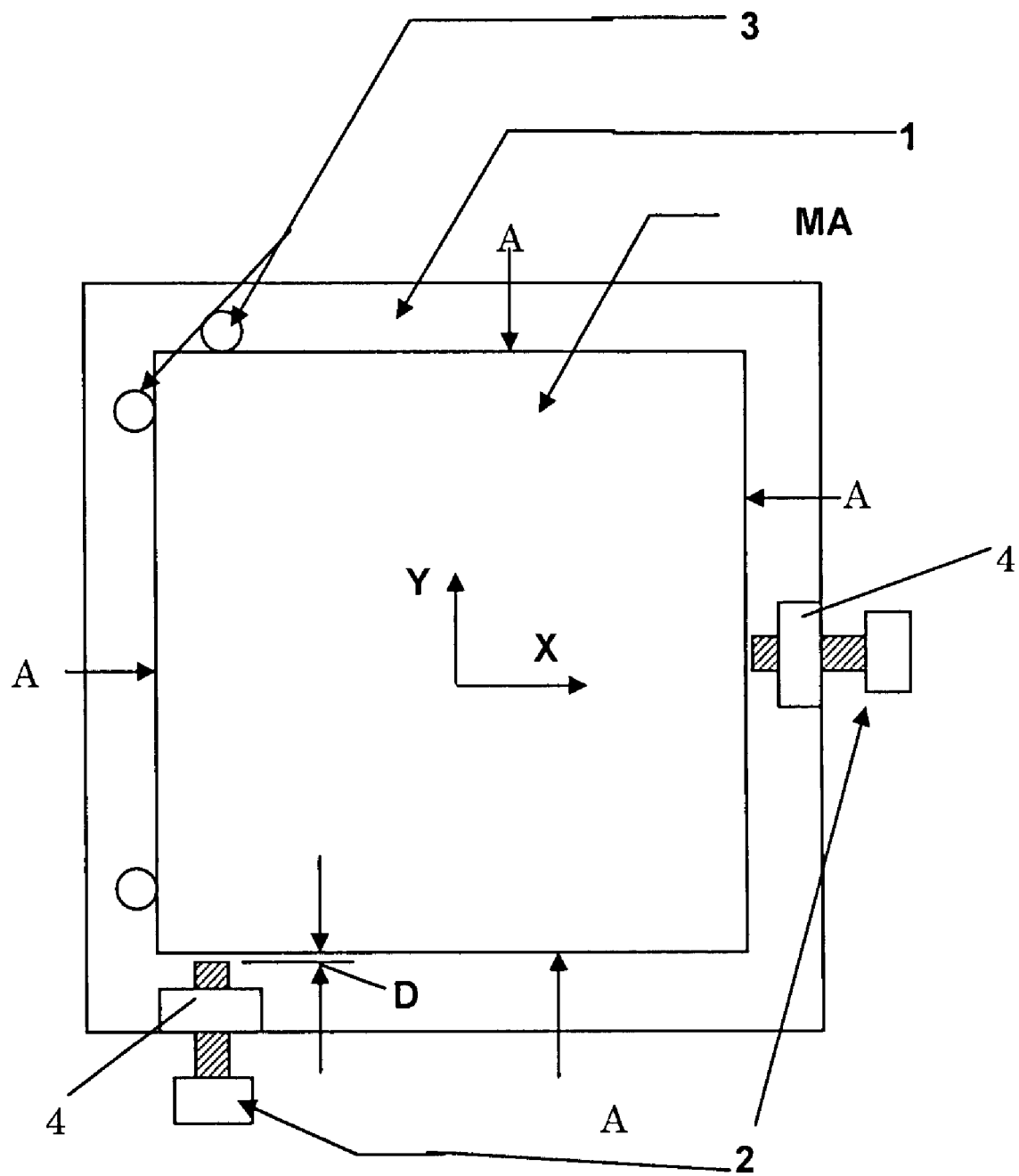
FIG. 5 schematically shows a top view of an assembly of a reticle and a reticle holder according to an embodiment of the invention.

Furthermore, the storage container 10 is provided with a number of retainers 12, which are arranged to retain the reticle holder 1 in the storage container. In the present embodiment, each retainer is formed as a pivotal arm 12, which is arranged to hold the reticle holder 1 when the arm 12 is in a holder retaining state. This holding state of the retaining arms 12 is shown in FIGS. 2 and 3. The retaining arms 12 are movable to a releasing state, which is shown in FIG. 4, to release the reticle holder 1. Movement of the retainers 12 may be achieved in different ways, for example, using one or more electric actuators, electromechanical devices, bi-metal, mechanical actuating devices, springs and the like. The retainers 12 may be arranged, for example, to move automatically to a certain state when the storage container 10 is located on or near a certain control mechanism 15. This is schematically depicted in FIG. 5, which shows a control element 15 that enables rotation of a retaining arm 12 about a pivot axis 16 towards the releasing state when the storage container 10 is positioned above the control element 15. Reverse movement of the retaining arm 12 may be achieved, for example, by springs, gravity, and/or other suitable device. The retainers 12 may be arranged and formed in various different ways, including, for example, one or more pivotable, translatable, rotating, and/or deformable retaining elements, gripping elements and/or the like.

The storage container 10 is used to store an assembly of a reticle holder 1 and a reticle MA. Therefore, the reticle MA and the reticle holder 1 may be stored together, so that the reticle MA may be handled efficiently, particularly when the reticle MA and reticle holder 1 are to be used and/or transported jointly. The storage container 10 may prevent contamination of the whole assembly of reticle MA and reticle holder 1. The reticle MA may not have direct contact with the storage container 10 when being stored therein by the reticle holder 1, which further reduces the chance of reticle contamination. Moreover, chances of reticle damage due to contact with the storage container 10 may be reduced in this manner.

Figure 3:
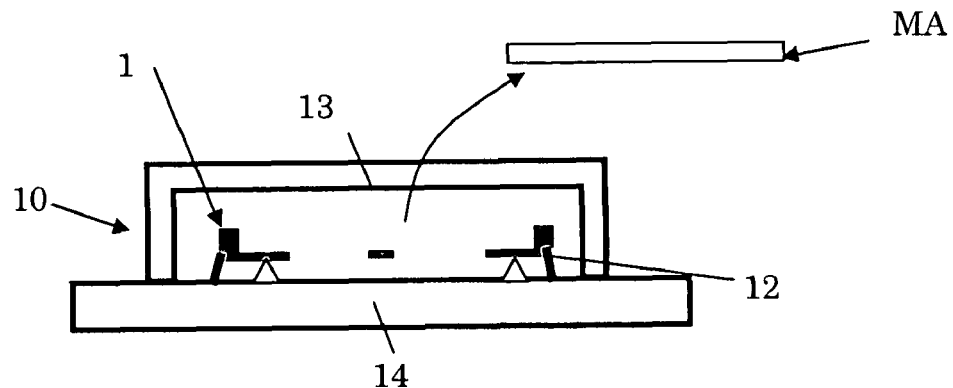
FIG. 3 shows a view similar to FIG. 2, in which the reticle holder is being held in the storage container without the reticle.

When the retainers 12 of the storage container 10 are in the retaining state, the reticle holder 1 is firmly held in the storage container 10 so that the reticle MA may be removed safely and easily from the reticle holder 1, as is depicted in FIG. 3. During the reticle removal, the storage container cover 13 is separated temporarily from the base 14. Removal of the reticle MA may be desired, for example, to clean the reticle and/or to use the reticle MA in a certain manufacturing process and/or apparatus without the reticle holder 1. Removal and movement of the reticle MA may be achieved, for example, by suitable actuators, one or more robots, by hand and/or by other suitable device.

As is shown in FIG. 4, the reticle holder 1 is released from the storage container 10 when the retainers 12 are in their releasing state. Then, in case the cover 13 is removed from the base 14, the reticle holder 1 may be removed from the storage container 10, together with the reticle MA. Removal and movement of the reticle holder 1 may also be achieved, for example, by suitable actuators, one or more robots, by hand and/or other suitable device. Removal of the reticle may be desired, for example, to clean the assembly MA, 1 and/or to use the reticle MA in a certain manufacturing process and/or apparatus together with the reticle holder 1.

FIG. 5 shows a top view of an embodiment of the present invention. This embodiment includes an assembly of a reticle MA and a reticle holder 1. The reticle holder 1 may be arranged in several ways to hold the reticle MA. In the present embodiment, the reticle holder is formed as a supporting frame 1 for supporting a side of the reticle MA. The reticle holder 1 may include and/or be part of, for example, a reticle carrier, storage container or the like.

According to the invention, the state of the reticle holder 1 is adjustable between a form closed reticle blocking state and a reticle releasing state. The reticle holder 1 is arranged to hold and/or position at least an edge A of the reticle MA in a form closed manner—in longitudinal direction—when the reticle holder 1 is in the blocking state. That is, when the reticle holder 1 is in the blocking state, the reticle holder 1 holds the reticle MA without friction. Therefore, the reticle holder 1 may hold the reticle MA firmly in a desired longitudinal reticle position, preferably without using force closure, which results in relatively little or no friction between the reticle MA and reticle holder 1 during horizontal acceleration thereof. In the present embodiment, the reticle edge A includes four substantially flat reticle surfaces which extend perpendicular to the plane of FIG. 5. In the present embodiment, the longitudinal reticle direction is a horizontal direction as depicted in FIG. 5 by arrows X and Y. The reticle holder 1 is arranged to release the reticle MA when the reticle holder 1 is in the releasing state.

As is clearly depicted in FIG. 5, the reticle holder 1 is provided with retaining elements 2, 3 for holding the reticle MA in a form closed manner (without friction). Two movable reticle retaining elements 2 are provided, which are located opposite two parts of the reticle edge A during use. The reticle holder 1 further includes three immovable retaining elements 3 which are arranged to abut part of the remaining parts of reticle edge A. In the present embodiment, the immovable retaining elements 3 are located on the opposite side of the movable retaining elements 2 with respect to the form of the reticle MA.

The movable retaining elements 2 are movable between reticle blocking positions and reticle releasing positions for providing the form closed blocking state and releasing state, respectively. Each movable reticle retaining element 2 is arranged to be fixed in the blocking position. The distance D between each of the movable reticle retaining elements 2 and the reticle edge A is less than about 1 µm when that retaining element 2 is in the blocking position, as is shown in FIG. 5, so that the reticle MA is held on the support frame 1 in a substantially form closed state. The distance D may be less than circa 100 nm, more preferably substantially 0 nm, such that the retaining elements 2 nearly or substantially make contact with the reticle edge A without applying a clamping force thereon. The distance D between each movable reticle retaining element 2 and the reticle edge A is larger than about 1 µm, particularly larger than about 100 µm, more particularly larger than about 1 mm, when the retaining element 2 is in the releasing position.

Each movable retaining element 2 may have only one fixed blocking position. On the other hand, the blocking position of the retaining element 2 may be adjustable between several blocking positions, for example, to accommodate and retain reticles MA of different sizes and/or to precisely control the amount of form closure of the reticle.

Movement and fixation of each of the movable reticle retaining elements 2 may be achieved in various ways. The movable retaining element 2 may, for example, be slidably, translatably, and/or pivotably connected to the support frame 1. In an embodiment, each movable retaining element 2 movably extends through a guiding element 4 which is attached to the frame 1. The guiding element 4 may, for example, include interior screw thread for cooperation with outer screw thread of the retaining element 2. In that case, fixation of the movable retaining element 2 to the guiding element 4 may be achieved by the cooperation of the inner and outer screw tread coupling. Furthermore, the support frame 1 and/or guiding element 4 may include a locking device to lock the movable retaining element 2 in the blocking position, for example, a clicking structure, a clamping device, a locking pin or the like. Movement and fixation of the reticle retaining elements 2 may be achieved using various devices, for example, one or more electrical and/of mechanical actuators, by hand, by an electromagnetic device, by bi-metal and the like. The reticle holder 1 and/or an environment in which the reticle holder 1 is to be placed may be provided with such a device for moving and/or fixing the movable retaining elements 2.

A controller and a sensor may be provided for automatically controlling the movement of the movable retaining elements 2. The controller may include, for example, suitable computing devices, feed-back devices and/or electronics, for example, one or more computers, microcontrollers, or the like. The sensors may be, for example, arranged to measure the distance D between the reticle 1 and the retaining elements 2. The sensor may be arranged in different ways, for example, to perform optical, electrical, capacitive, inductive, force measurements and/or any other suitable measuring methods. The controller and sensor are not shown in the figures.

During use, a reticle MA is placed on the reticle holder 1, with the reticle edge A abutting the immovable retaining elements 3, so that the reticle MA is automatically aligned with respect to the reticle holder 1. Before the reticle MA is brought onto the reticle holder 1, the movable retaining elements 2 are brought to the releasing position, so that ample space is provided between the retaining elements 2, 3 for placement of the reticle MA without damaging the reticle MA and/or reticle holder 1. Then, the movable retaining elements 2 are moved to the blocking positions and fixed in those positions, so that the reticle MA is fixed with respect to the reticle holder 1 by longitudinal form closure, such that the position of the reticle MA is maintained in longitudinal directions X, Y without clamping the reticle MA to the reticle holder 1. The reticle MA may be released by moving the movable retaining elements 2 back to the releasing positions, so that the reticle MA may safely be removed from the holder 1. During the movement of the movable retaining elements 2, the distance D between these elements 2 and the reticle may be detected by the sensor, whereas the movement 2 of the elements 2 may be automatically controlled by the controller.

Figure 6:
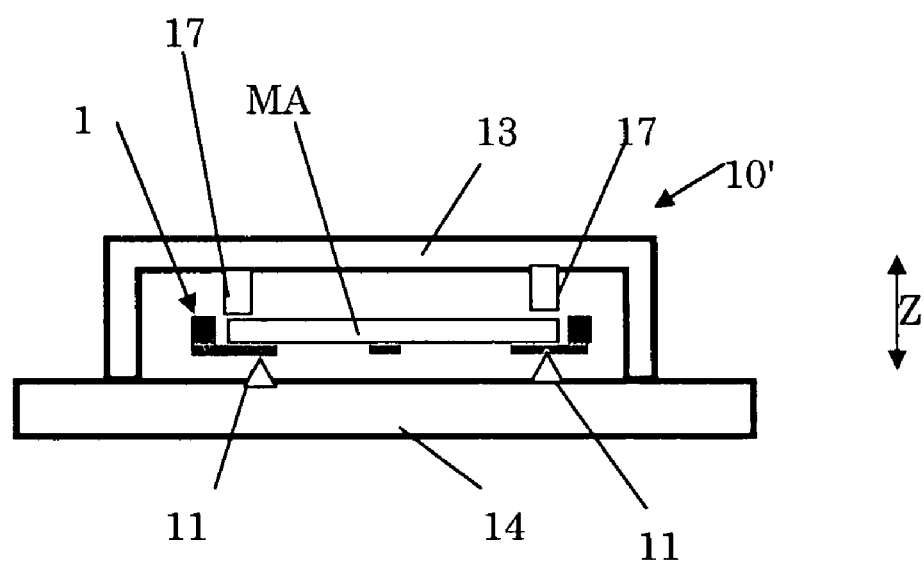
FIG. 6 schematically shows a partially opened side view of a further aspect of the embodiment of the invention shown in FIG. 5, in which the reticle is transversally fixed in the storage container using form closure.

The reticle MA may also be fixed in a transversal direction Z with respect to the reticle holder 1. This further aspect of the embodiment is shown in FIG. 6, showing a storage container 10' including a cover 13 which may be detachably connected to a base 14, wherein the cover 13 is arranged to transversally fix the reticle MA when the reticle MA and reticle holder 1 are positioned between the cover 13 and the base 14. The base 14 of the storage container 10' includes support elements 11 to support the reticle holder 1. Particularly, the cover 13 of the storage container 10' is provided with retaining elements 17 which extend at relatively small distances above the upper side of the reticle MA when the cover 13 is positioned onto the base 14 of the storage container 10', such that transversal movement, in a direction Z, of the reticle MA is prevented by form closure and not only by friction forces. The small distances between these retaining elements 17 and the reticle MA may be, for example, smaller than about 1 µM. By using the storage container 10' of FIG. 8 in combination with the reticle holder 1 of FIG. 5, the reticle MA may be fixed by form closure in all directions X, Y, Z during storage, transport, and the like. The retaining elements 17 of the cover 13 of the storage container 10' may be arranged in various ways and located in different positions. The retaining elements 17 may be, for example, movably or immovably coupled to the container cover 13. Furthermore, the reticle holder 1 as such may include retaining elements for fixing the reticle MA thereto in a transversal direction Z by form closure.

Figure 7:
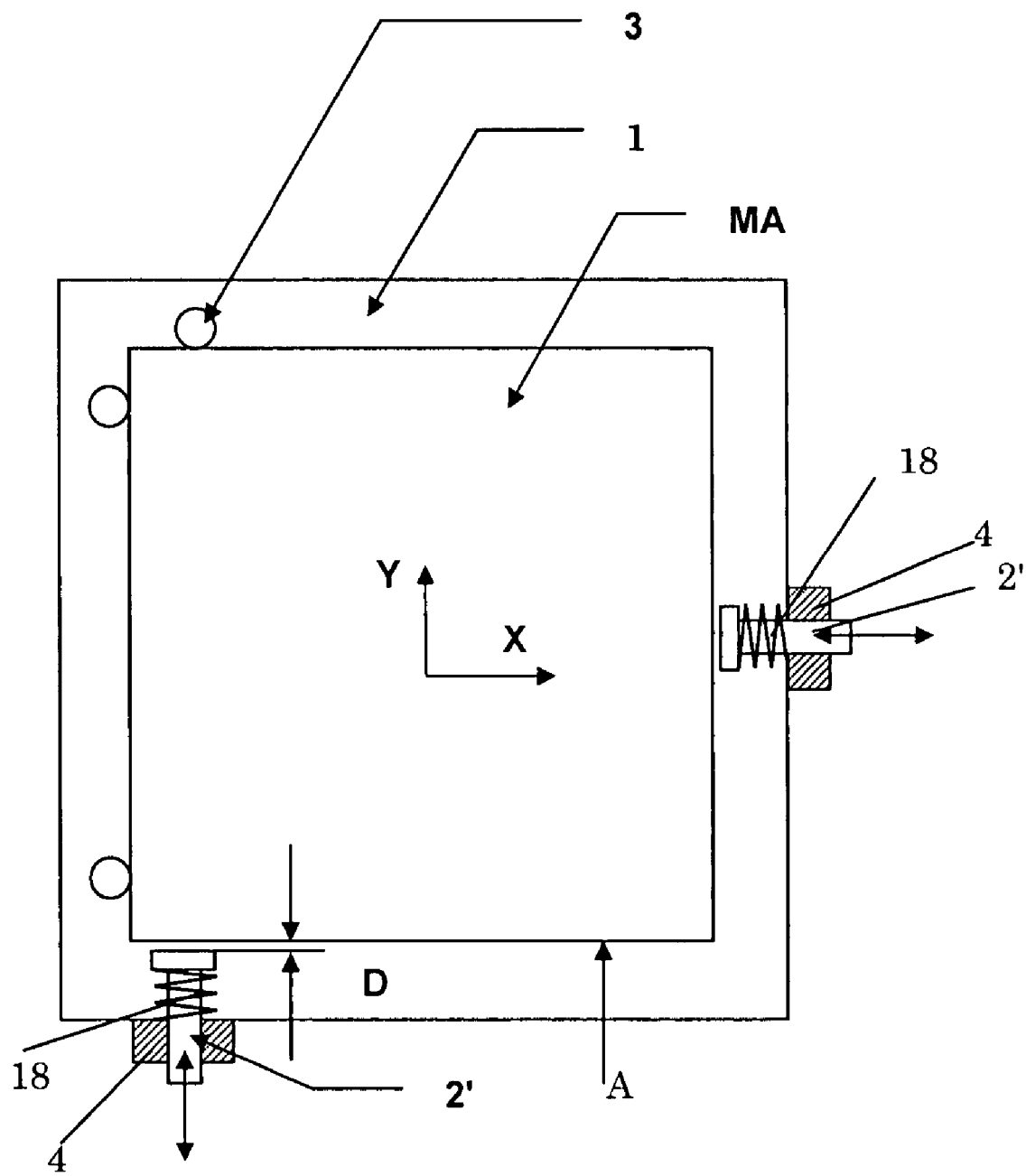
FIG. 7 schematically shows a top view, similar to FIG. 5, of an embodiment of the invention.

FIG. 7 shows an embodiment of the invention, which differs from the embodiment shown in FIG. 5 in that the reticle holder 1 includes resilient elements, for example springs 18, for moving the movable retaining elements 2' towards the reticle MA. For example, the resilient elements or springs 18 may have such spring constants that the retaining elements 2' press the reticle MA towards the opposite fixed retaining elements 3 without damaging the reticle MA. After the reticle MA is positioned onto the holder 1, the positions of the movable retaining elements 2' are fixed, such that the reticle MA is transversally held substantially by form closure and substantially not by force closure. To this aim, the guiding elements 4 may be arranged to guide the movable retaining elements 2' not farther towards the reticle MA than a suitable blocking position for blocking the reticle MA without applying a clamping or friction force thereon. In that case, the springs 18 may serve to fix the movable retaining elements 2' in the blocking positions. On the other hand, the reticle holder 1 may be provided with fixation devices, not shown in the figure, which are arranged to retract each movable retaining element 2' over a small distance away from the reticle MA and towards a suitable blocking position when the fixation devices are activated. The small distance may be, for example, a distance of less than circa 1 μm. In that case, the fixation devices prevent that the springs 18 from clamping the reticle MA between the retaining elements 2', 3'.

Figure 8:
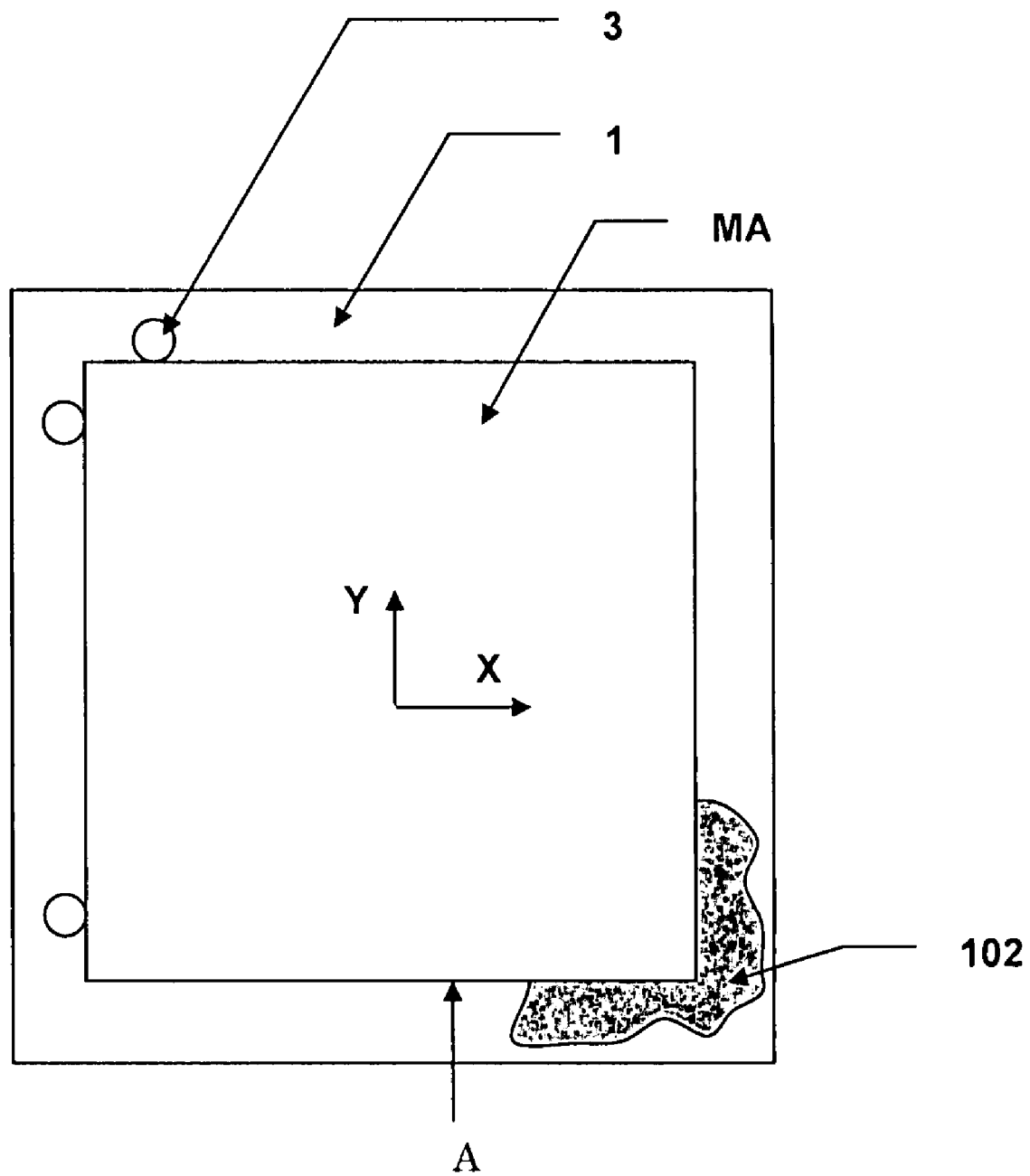
FIG. 8 schematically shows a top view, similar to FIG. 5, of an embodiment of the invention.

An embodiment of the invention is depicted in FIG. 8 in which the reticle holder 1 includes a substance 102, for example, a freezable fluid, a ferromagnetic fluid, and/or a thermoplastic, which may be brought into a solid state and a deformable state for providing the blocking state and releasing state respectively. The reticle holder 1 may include three fixed retaining elements 3 for retaining the reticle edge A on the opposite side with respect to the substance 102. Therefore, relatively little of the substance 102 may be used to fix the reticle MA with respect to the reticle holder 1. During use, the reticle MA is positioned with the edge A against the fixed retaining elements 3, while the substance 102 is in the deformable state. Then, the substance 102 is simply brought into the blocking state to fix the reticle MA. Alternatively, the reticle holder 1 may be provided with the substance 102 which extends around a larger portion of the reticle edge A, for example completely around the edge A, to provide reticle fixation.

Figure 9:
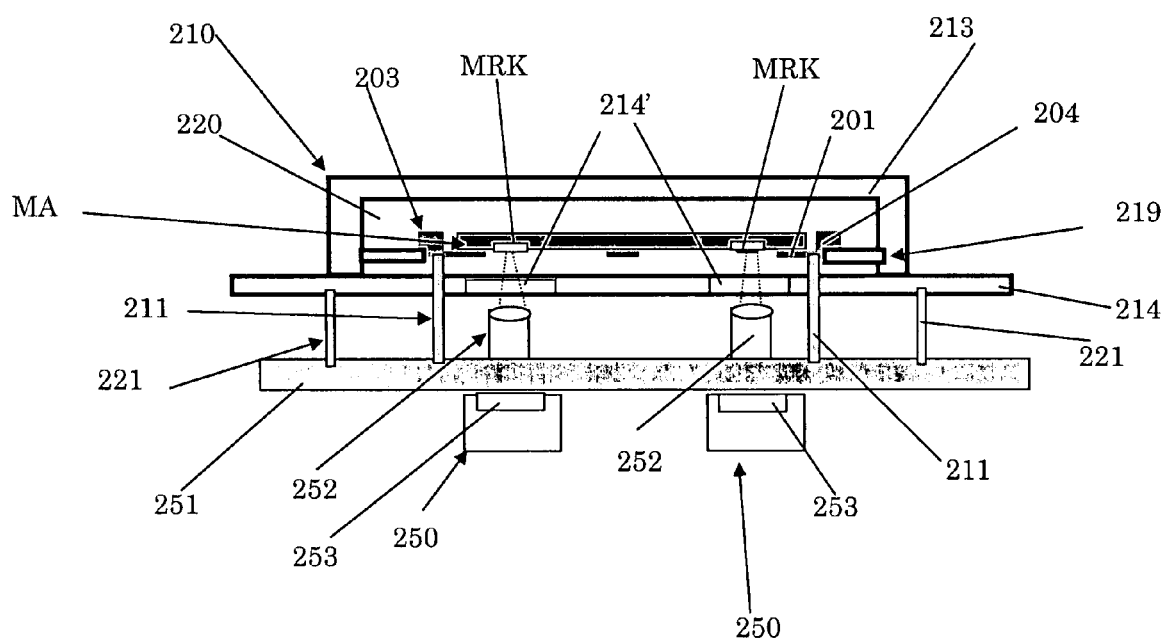
FIG. 9 schematically shows a side view of an embodiment of the invention.
Figure 10:
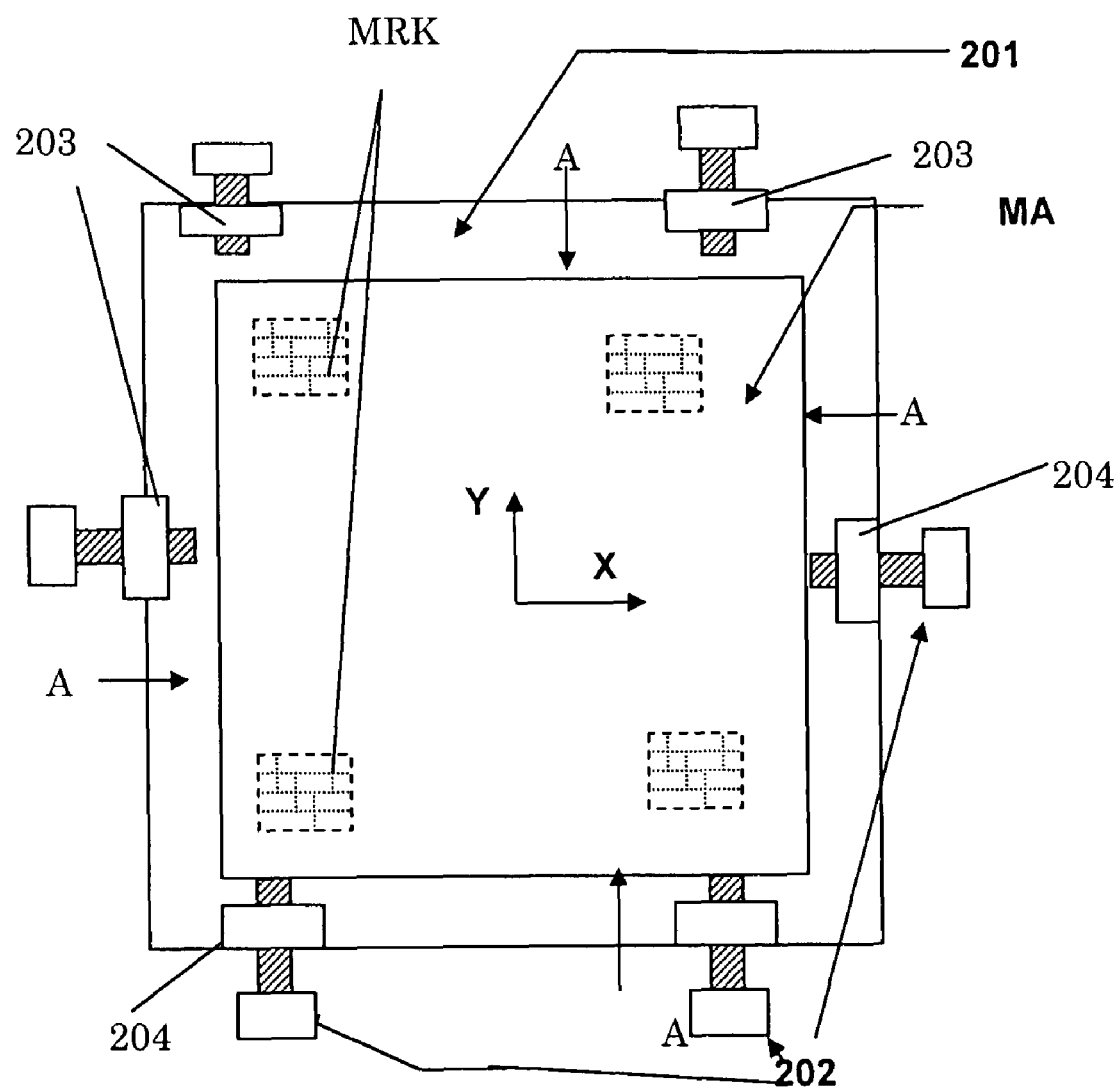
FIG. 10 schematically shows a top view of an embodiment of the invention.

FIG. 9 schematically depicts an embodiment of the invention. This embodiment is an alignment system including an assembly of a reticle MA and reticle holder 201. The assembly MA, 201 may be, for example, similar to or the same as an assembly according to any of the embodiments shown in FIGS. 5,7,8. In that case, the state of the reticle holder 201 is adjustable between a form closed reticle blocking state and a reticle releasing state. The assembly may be as shown in the embodiment of FIG. 10, in which the reticle holder 201 includes several adjustable retainers 202, 203 for holding the reticle MA by form closure, or by force fixation.

In the embodiment of FIG. 9, the bottom side of the reticle MA includes a plurality of alignment markers MRK. In FIG. 10, the markers MRK are schematically shown by dashed lines. Each of the markers MRK is optically detectable. Such markers MRK are generally known in the art, and may include various structures and marker configurations suitable for alignment purposes.

The embodiment of FIG. 9 also includes an optical system for aligning the reticle MA with respect to the reticle holder 201. The optical system includes a plurality of detectors 250. The detectors 250 are arranged to detect the reticle markers MRK for positioning the reticle MA with respect to the reticle holder 201. To this aim, each detector 250 includes an optical sensor 253 and at least one optical element 252, such as microscope optics 252 including one or more lenses or the like. The microscope optics 252 is arranged to enlarge the image of a reticle marker MRK onto the optical sensor 253, when the reticle MA is in the position shown in FIG. 9. The optical sensor 253 may be, for example, an electronic camera, a CCD camera and/or the like. The optics 252 may be, for example, controllable for focussing the images of the markers during use.

According to an embodiment, the reticle holder 201 and the detector 250 are arranged to be kinematically aligned with respect to each other. In the present embodiment, this is achieved by a support structure 251 for supporting the reticle holder 1, in which the reticle holder 201 may be kinematically aligned with respect to that support structure 251, whereas the detectors 250 are located in certain predetermined detector positions with respect to the support structure 251 for detecting the reticle markers MRK. In the present embodiment, the detectors 250 are attached to the support structure 251. Alternatively, one or more detectors 250 may also be at least partly located in other positions, for example being detached from the support structure 251.

The support structure 251 includes first docking elements 211 that may be arranged to cooperate with docking apertures of the reticle holder 201 for kinematically docking the reticle holder 201 onto the support structure 251. The reticle holder 201 may be, for example, a kinematic handling frame for kinematically aligning the reticle MA with respect to a certain apparatus, particularly with respect to a lithographic apparatus. The reticle holder 201 may also include, for example, a plurality of reticle handling brackets. The support structure preferably provides at least three, more preferably only three, kinematic support points for cooperating with at least three kinematic grooves, for example, V-grooves, of a reticle holder 201. The support point may be, for example, round-tip pins or suchlike.

The support structure 251 may include one or more docking apertures that are arranged to cooperate with suitable docking elements of the reticle holder for kinematically docking the reticle holder onto the support structure 251.

The functioning of such kinematical docking has already been described above. Such kinematical docking may be achieved in various ways, for example, by using tapered pin-shaped support elements 211, while the bottom of the reticle holder 201 is provided with tapered receiving openings, or V-shaped grooves, for receiving the tapered support elements 211, as has already been shown schematically in FIGS. 2-4. By applying such kinematic positioning, the reticle holder 201 may be aligned quickly and accurately with respect to the detectors 250.

The embodiment shown in FIG. 9 also includes a storage container 210, which is arranged for storing the assembly of a reticle MA and the reticle holder 201. Such a storage container may have the above-mentioned advantages. For example, the reticle MA and the reticle holder 201 may be stored together so that the reticle MA may be handled efficiently, particularly when the reticle MA and reticle holder 201 are to be used and/or transported jointly. The storage container 210 may prevent contamination of the whole assembly of reticle MA and reticle holder 201.

The storage container 210 of the embodiment shown in FIG. 9 may be, for example, substantially the same as or similar to the one shown in FIGS. 2-4, 6. The storage container 210 of the embodiment shown in FIG. 9 includes a base 214 and a cover 213 that enclose a storage space 220. The cover 213 is detachably coupled to the base 214, for example, by a clicking structure, a clamping device, a spring and/or any other suitable device. In the present embodiment, the base 214 of the storage container 210 is provided with openings for allowing the support elements 211 of the support structure 251 to reach the reticle holder 201, when the reticle holder 201 is stored in the storage container 210. The opening of the container base 214 may be, for example, through-holes, perforations or the like. Suitable closing devices, for example, caps, inserts or the like, may be provided for closing there openings when the support elements 211 do not extend therethrough. Such closing devices are not shown in FIG. 9. The present storage container 201 includes side supports 219 for holding the reticle holder 201 at a certain position in the storage container 210. Such side supports 219 may be arranged in various ways, and may be, for example, attached to the bottom 214 of the storage container. Also, the storage container 210 may be provided with a number of retainers which are arranged to retain the reticle holder 201 in the storage container, for example after the reticle holder 201 has been aligned kinematically onto the support structure 251.

Such retainers may be provided in various ways, see for example, the above discussion concerning FIGS. 2-4, and have not been shown in FIG. 9.

The storage container 210 is at least partially optically transparent, such that the detectors 250 may optically detect the reticle markers MRK when the system is in the operating position as is shown in FIG. 9. To this aim, in the present embodiment, at least the parts 214' of the bottom 214 of the storage container, the parts 214' extending between the markers MRK and opposite microscope optics 252 of the detectors 250 during use, are made of transparent material, for example, a transparent plastic, glass, or the like.

In the present embodiment, the support structure 251 is also arranged for kinematically docking the storage container 210 thereon. Particularly, the support structure includes second docking elements 221, or—alternatively—second docking apertures, which are arranged to cooperate with second docking apertures, or alternative second docking elements, of the reticle holder storage container 210. The storage container is arranged to cooperate with the support structure 251, via the docking elements and docking apertures, for kinematically docking the storage container 210 onto the support structure 251. Also, in this case, the kinematical docking may be achieved in various ways, for example, in a manner described above.

The alignment system shown in FIG. 9 includes a mechanism 203, 204 for moving the reticle MA and reticle holder 201 with respect to each other, for aligning the markers MRK of the reticle MA with respect to the optical sensors 253 of the detectors 250, when the reticle holder 201 has been kinematically positioned onto the support structure 251. Such a mechanism may be provided in various ways. For example, the mechanism 203, 204 may be the same as, or at least include, the adjustable retainers 202, 203 of the reticle holder 201 embodiment shown in FIG. 10. Alternatively, the storage container 210 may be provided, for example, with such a mechanism for moving the reticle MA with respect to the reticle holder 201. Such a mechanism for manipulating the reticle with respect to the reticle holder 201 may be an automated and/or manually operable mechanism.

The present embodiment preferably includes controllers for automatically controlling the movement of various system parts with respect to each other during use. Also, the present embodiment preferably includes movement devices for moving the reticle holder 201, storage container 210 and/or support structure 251 with respect to each other, for example, one or more robots, actuators, and/or the like. The controller may also be arranged for processing data and/or signals being generated by the detectors as a result of marker MRK detection. The controllers may include, for example, suitable computing devices, feed-back devices, and/or electronics, for example, one or more computers, microcontrollers, software, or the like. The controllers and movement devices are not shown in FIG. 9.

During use of an embodiment, the assembly of the reticle MA and reticle holder 201 may be stored in the storage container 210, for protecting the assembly and for prevention contamination thereof. Then, the reticle MA and the reticle holder 201 may be simply aligned with respect to each other in the following manner, without having to remove the reticle and/or reticle holder from the storage container 210.

To this aim, the storage container 210 is positioned kinematically onto the second docking elements 221 of the support structure 251. During this positioning, the first docking elements 211 of the support structure 251 reach through the respective openings of the storage container bottom 214 and cooperate with the reticle holder 201 for achieving the kinematical alignment thereof. As a result, the reticle holder 201 has been kinematically aligned with respect to the optical detectors 250, which have known positions with respect to the support structure 251. Preferably, each of the kinematical alignments is achieved by three kinematic support points cooperating with three kinematic grooves.

Then, the reticle MA is positioned with respect to the reticle holder 201 by utilizing detection of the markers MRK by the detectors 250. Herein, images of the markers MRK are being projected onto the optical sensors 253 by respective microscope optics 252. The positioning of the reticle MA is achieved by the moving mechanism 203, 204. Particularly, the reticle MA and reticle holder 201 are manipulated in such a way with respect to each other that the markers MRK of the reticle are aligned with respect to the optical sensors 253 of the detectors 250, so that the markers MRK reach certain desired, pre-known marker positions with respect to the detectors 250. For example, the controller is arranged for realizing such a reticle movement with respect to the reticle holder. The reticle MA may be aligned such that, for example, the reticle may be placed on a reticle stage MT of a lithographic apparatus directly, using the reticle holder 201, without any further alignment steps being necessary. A relatively precise positioning may be achieved by the application of microscope optics 252, which enlarge images of the markers MRK onto the optical sensors 253.

Preferably, the reticle MA is fixed to the reticle holder 201 after the reticle has been positioned with respect to the reticle holder 201. Then, the storage container 210 may, for example, be transported to a location wherein the reticle MA is to be used, for example, to a lithographic apparatus as described above for use in the manufacturing of devices. After the above-described reticle alignment, the reticle MA may preferably be placed directly on the reticle stage MT of the lithographic apparatus, which may lead to relatively low downtimes and high throughput of the apparatus.

In the present embodiment, the reticle holder 201 and the mask MA are simply aligned with respect to one another, utilizing optical devices MRK, 250 and kinematic alignment devices 211. Therefore, the handling of the reticle is facilitated. For example, the reticle MA may already be located on the holder 201 when the reticle holder 201 is being stored in the storage container 210. After that, the reticle MA may be aligned with respect to the reticle holder 201 without having to remove the reticle/reticle holder assembly from the storage container 210. Thus, the alignment of the reticle MA may be achieved in a relatively clean, particle free environment. Herein, the support structure 251 and the detectors 250 may function as a pre-aligner, providing for a fast, clean and efficient reticle alignment.

While specific embodiments of the invention have been described above, it will be appreciated that the invention may be practiced otherwise than as described. The description is not intended to limit the invention.

The storage container may be arranged for storing an assembly that includes at least a reticle and a reticle holder, such that the state of the reticle holder is, for example, not adjustable between a form closed reticle blocking state and a reticle releasing state. The storage container may be provided with at least one retainer that is arranged to retain the reticle holder. This provides the above-mentioned advantages of the retainer independently of holding the reticle by form closure. In particular, the handling possibilities of the reticle and reticle holder assembly are improved when using such storage container, as is depicted in FIGS. 2-4.

The reticle MA may also be provided in various ways and shapes, including but not limited to rectangular, square, and circular.

Furthermore, the reticle holder and/or storage container may be arranged to transport and/or store the reticle in a horizontal, vertical and/or other reticle state. The reticle holder and/or storage container may further be arranged for positioning the reticle with respect to an environment and/or an apparatus.

Each reticle holder may be arranged to hold one or more reticles. The same holds for the storage container. The storage container may also be arranged to hold one or more reticle holders, for example, one or more reticle holding frames, and/or one or more inner reticle storage containers.

The reticle may be held in one or more directions substantially by form fixation. Force fixation may be applied, for example, to hold the reticle in remaining directions.

Further, the reticle MA may be held substantially by form closure in at least one direction and substantially not by force closure in that direction. Herein, the term "substantially not by force closure" is to be construed broadly, for example, such that the reticle holder applies a remaining retaining force of about 10 N or less to the reticle.

A reticle alignment method according to the present invention, as described above, may be carried out in a vacuum environment, for example, in a separate module that is designed for that function. Also, the a reticle alignment may be carried out, for example, in a storage module, load lock, scanner or in other devices.

A system may be provided that includes, for example, one or more assemblies of reticles MA and reticle holders 201, where each reticle holder is arranged for holding a respective reticle, such that each assembly MA, 201 may be removably stored in a suitable storage container 210. Each storage container 210 and/or reticle holder 201 may be, for example, arranged to be manually transported or the like.

What is claimed is:

1. A system for use in a lithographic apparatus, the system comprising:
   an assembly of a reticle and a reticle holder, the reticle comprising a marker;
   a position detector configured to detect said reticle marker to position the reticle with respect to the reticle holder;
   a storage container configured to store said assembly during the positioning of the reticle with respect to the reticle holder, wherein the reticle holder and the detector are configured to be kinematically aligned with respect to each other; and
   a support structure configured to support the reticle holder, wherein the support structure comprises docking elements or docking apertures, which are configured to cooperate with docking apertures or docking elements of the reticle holder, respectively, to kinematically dock the reticle holder onto the support structure, wherein said detector is located in a detector position with respect to the support structure for detecting said reticle marker during use.

2. A system according to claim 1, wherein the reticle holder prevents movement of the reticle with respect to the reticle holder in at least one direction without friction when the reticle holder is in a form closed reticle blocking state, and releases the reticle when the reticle holder is in a reticle releasing state.

3. A system according to claim 1, further comprising a mechanism configured to move the reticle and the reticle holder with respect to each other.

4. A system according to claim 3, wherein the mechanism comprises adjustable retainers configured to hold the reticle by form closure or by force fixation.

5. A system according to claim 3, wherein the mechanism is configured to move the reticle when said assembly is located in said storage container.

6. A system according to claim 1, wherein said detector is attached to said support structure.

7. A system according claim 1, wherein the support structure comprises three kinematic support points configured to cooperate with three kinematic grooves of the reticle holder.

8. A system according to claim 1, wherein said detector comprises an optical sensor configured to detect said marker.

9. A system according to claim 1, wherein said detector comprises an optical element configured to enlarge an image of the marker.

10. A system according to claim 9, wherein said optical element comprises microscope optics.

11. A system according to claim 1, wherein said detector comprises an electronic camera configured to detect said marker.

12. A system according to claim 11, wherein said electronic camera comprises a CCD camera.

13. A support structure of a system according to claim 1, the support structure further being configured to kinematically dock the storage container when the reticle holder is being held in the storage container.

14. A support structure of a system according to claim 13, the support structure further comprising second docking elements or second docking apertures that are configured to cooperate with second docking apertures or second docking elements, respectively, of the storage container.

15. A reticle holder of a system according to claim 1.

16. A storage container configured to contain an assembly of a system according to claim 1.

17. A storage container according to claim 16, the storage container comprising a retainer that is configured to retain the reticle holder when the retainer is in a holder retaining state, wherein the retainer is configured to release the reticle holder when the retainer is in a holder releasing state.

18. A system for use in a lithographic apparatus, the system comprising:
   an assembly of a reticle and a reticle holder, the reticle comprising a marker;
   a position detector configured to detect said reticle marker to position the reticle with respect to the reticle holder;
   a storage container configured to store said assembly during the positioning of the reticle with respect to the reticle holder, wherein the reticle holder and the detector are configured to be aligned with respect to each other with a plurality of precision-machined mechanical contacts that are arranged to prevent relative movement between the reticle holder and the detector in at least two directions; and
   a support structure configured to support the reticle holder, wherein the support structure comprises docking elements or docking apertures, which are configured to cooperate with docking apertures or docking elements of the reticle holder, respectively, to kinematically dock the reticle holder onto the support structure, wherein said detector is located in a detector position with respect to the support structure for detecting said reticle marker during use.

19. A lithographic apparatus comprising:
   an illumination system for providing a beam of radiation;
   a reticle system, the reticle system having:

an assembly of a reticle and a reticle holder, the reticle being configured to impart the beam of radiation with a pattern in its cross-section, the reticle comprising a marker, a position detector configured to detect the reticle marker to position the reticle with respect to the reticle holder, and a storage container for storing said assembly during the positioning of the reticle with respect to the reticle holder; a substrate table configured to hold a substrate;

a projection system configured to project the patterned beam onto a target portion of the substrate, wherein the reticle holder and the position detector are configured to be kinematically aligned with respect to each other; and a support structure configured to support the reticle holder, wherein the support structure comprises docking elements or docking apertures, which are configured to cooperate with docking apertures or docking elements of the reticle holder, respectively, to kinematically dock the reticle holder onto the support structure, wherein the position detector is located in a position with respect to the support structure for detecting said reticle marker during use.

20. A device manufacturing method comprising:

positioning a reticle with respect to a reticle holder, the reticle comprising a marker;

detecting the marker for said positioning the reticle with respect to the reticle holder with a position detector;

kinematically aligning the reticle holder and the position detector with respect to each other, comprising:

supporting the reticle holder using a support structure, wherein the support structure comprises docking elements or docking apertures, which are configured to cooperate with docking apertures or docking elements of the reticle holder, respectively, to kinematically dock the reticle holder onto the support structure, wherein the position detector is located in a detector position with respect to the support structure for detecting said reticle marker during use;

storing the reticle and the reticle holder in a storage container during said positioning the reticle with respect to the reticle holder;

patterning a beam of radiation with the reticle; and projecting the patterned beam of radiation onto a target portion of a substrate.

* * * * *